United States Patent [19]
Pascucci

[11] Patent Number: 5,847,584
[45] Date of Patent: Dec. 8, 1998

[54] THRESHOLD DETECTING DEVICE

[75] Inventor: Luigi Pascucci, Sesto San Giovanni, Italy

[73] Assignee: SGS-Thomson Microelectronics S.r.l., Agrate Brianza, Italy

[21] Appl. No.: 688,956

[22] Filed: Jul. 31, 1996

[30] Foreign Application Priority Data

Aug. 4, 1995 [EP] European Pat. Off. .............. 95830360

[51] Int. Cl.$^6$ ....................................................... H03K 5/22
[52] U.S. Cl. .............................................. 327/68; 327/74
[58] Field of Search ........................... 327/68–72, 74–76, 327/51, 55, 77, 78, 88

[56] References Cited

U.S. PATENT DOCUMENTS

| | | | |
|---|---|---|---|
| 3,851,259 | 11/1974 | Porawski | 327/69 |
| 4,532,535 | 7/1985 | Gerber et al. | 357/23.5 |
| 4,658,156 | 4/1987 | Hashimoto | 307/350 |
| 4,677,388 | 6/1987 | Morrison | 327/72 |
| 4,964,084 | 10/1990 | Jung et al. | 365/226 |
| 5,047,667 | 9/1991 | Howie | 327/69 |
| 5,488,449 | 1/1996 | Joo | 327/72 |

FOREIGN PATENT DOCUMENTS 0 260 474   3/1988   European Pat. Off. .
0 408 368   1/1991   European Pat. Off. .

OTHER PUBLICATIONS

Takashima, Daisaburo, et al., "Low–Power On–Chip Supply Voltage Conversion Scheme for Ultrahigh–Density DRAM's," *IEICE Transactions on Electronics,* No. 5, May 1993, pp. 844–849.

*Primary Examiner*—Toan Tran
*Attorney, Agent, or Firm*—Seed and Berry LLP

[57] ABSTRACT

A threshold detecting device including a detecting stage having a first input supplied with a monitored voltage varying between a first and second value, a second input supplied with a reference voltage by a reference source stage, and an output supplying a logic signal indicating crossover of a predetermined threshold by the monitored voltage. Initially, the reference source stage is off and the reference voltage follows the course of the monitored voltage; upon the monitored voltage exceeding a first threshold value, the reference source is turned on and causes the reference voltage to rise more slowly than the monitored voltage, so that an increasing voltage difference is present between the first and second inputs of the reference stage; and, upon the voltage difference exceeding a second threshold value, the detecting stage switches and generates the threshold crossover signal.

24 Claims, 6 Drawing Sheets

THRESHOLD DETECTING DEVICE

TECHNICAL FIELD

The present invention relates to a threshold detecting device, in particular for determining whether the booster or supply voltage of a storage device has reached a predetermined threshold permitting the performance of various functions.

BACKGROUND OF THE INVENTION

As is known, to permit the performance of functions requiring a high supply voltage, nonvolatile memories with a low supply voltage Vcc comprise a voltage booster section for generating a higher output voltage. For example, in the case of flash memories with a supply voltage of only 3 V, a voltage booster is required for generating the cell reading voltage. As the voltage booster, when turned on, takes some time to supply the required output voltage, circuits are required for determining the output level of the voltage booster and indicating when it reaches the minimum acceptable threshold, i.e., by generating an enabling signal permitting performance of the high-voltage functions.

As the device, too, when turned on, presents a transient state before reaching the steady-state supply voltage, which, in currently used memories, must be guaranteed to prevent malfunctioning, a detecting circuit is again required for monitoring the supply voltage and generating an enabling signal upon the supply voltage reaching a predetermined threshold.

The booster and supply voltage monitoring circuits of known devices are implemented in various ways. One commonly used solution, for example, comprises a differential circuit, one input of which is supplied with a reference voltage, another input of which is supplied with the monitored voltage, and which generates a logic signal whose state depends on the outcome of the comparison of the two input voltages. Though widely used, the static consumption of such circuits, i.e., following evaluation and during steady-state operation of the memory or device in which they are integrated, is far from negligible. Moreover, since the supply voltage has not yet reached the steady-state condition, the reference voltage and the outcome of the voltage comparison are unreliable, thus ruling out transient-state application of the circuits.

SUMMARY OF THE INVENTION

It is an object of the present invention to provide a detecting circuit designed to overcome the aforementioned drawbacks, and which therefore provides for a drastic reduction in consumption, and presents trigger characteristics independent of the transient state.

The threshold detecting device of this invention includes a detecting stage having a first input supply with a monitored voltage varying between a first and a second value, a second input supplied with a reference voltage, and an output supplying a logic signal indicating the monitored voltage has exceeded a predetermined threshold. A reference source stage having an output is coupled to the second input for generating a reference voltage varying more slowly than the monitored voltage. The detecting stage determines the difference between the monitored voltage and the reference voltage and compares the difference with a first predetermined threshold value. The detecting stage also generates a threshold crossover signal when the difference exceeds the first predetermined threshold value.

Another object of the present invention includes providing a threshold crossover detecting method having the steps of: supplying a monitored voltage varying between a first and second value, generating a reference voltage varying more slowly than the monitored voltage, comparing the monitored voltage and the referenced voltage, and generating a threshold crossover signal in the event the difference between the monitored voltage and the reference voltage exceeds a predetermined threshold value.

BRIEF DESCRIPTION OF THE DRAWINGS

A number of preferred, non-limiting embodiments of the present invention will be described by way of example with reference to the accompanying drawings.

DETAILED DESCRIPTION OF THE INVENTION

Figure 1:
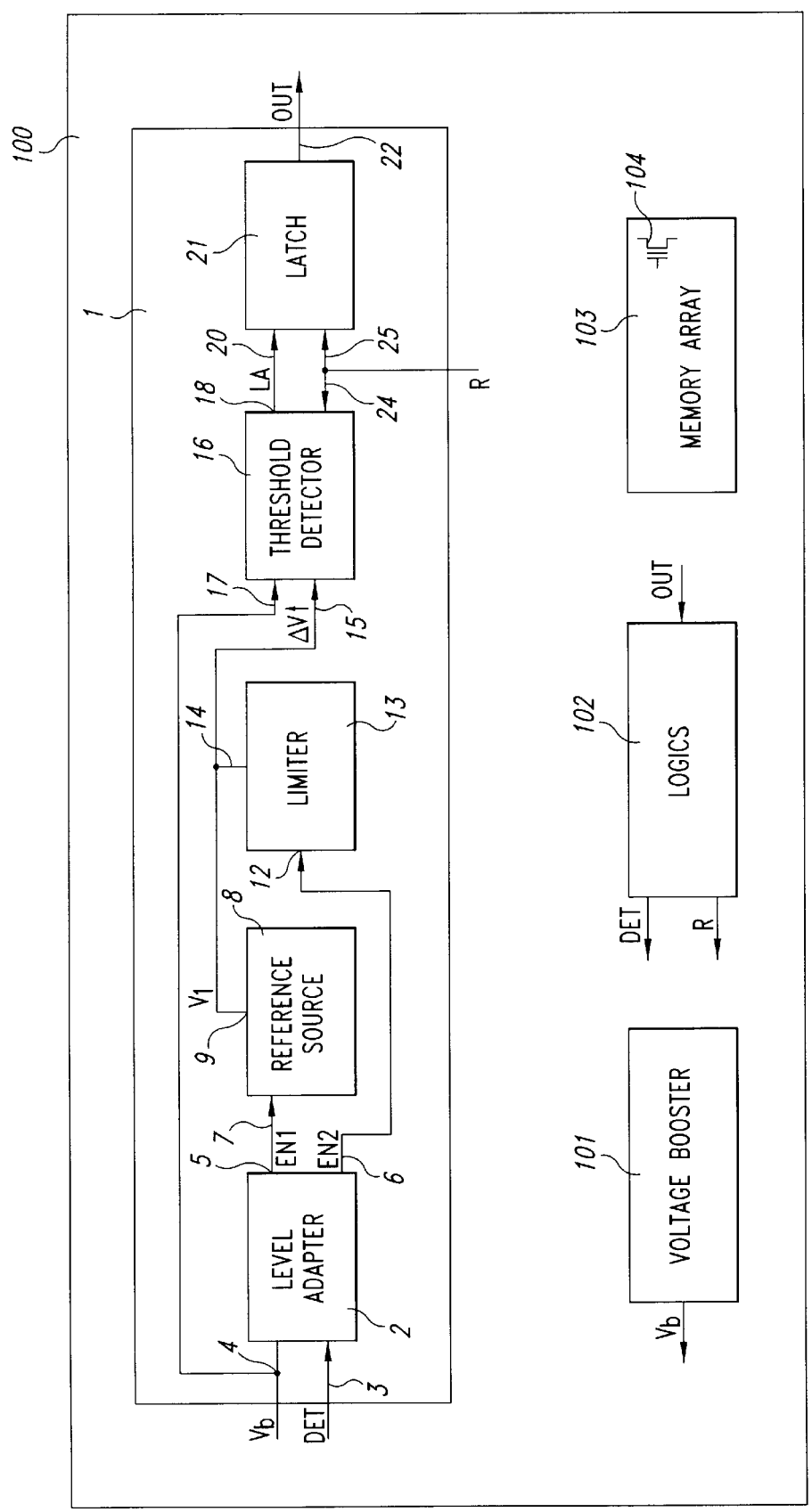
FIG. 1 shows a block diagram of a first embodiment of the present device for monitoring booster voltage.

FIG. 1 shows a device 1 for detecting when a booster voltage Vb reaches a given threshold. Device 1 is integrated in a known memory 100 comprising a voltage booster stage 101 supplying booster voltage Vb; a logic portion 102 generating signals DET and R for turning on and resetting device 1, and which is supplied by device 1 with an output signal OUT, the logic value of which indicates whether or not booster voltage Vb has exceeded a given threshold; and a memory array 103 comprising memory cells 104. Circuits of the same type as voltage booster circuit 101, logic portion 102 and memory array 103 are well known in the art. Any person of skill in the art would be able to use existing circuits to provide these devices and their output if given the teachings of this patent.

Device 1 includes a level adapting stage 2 having two inputs 3, 4 supplied respectively with a monitoring enabling signal DET and the monitored voltage Vb, and two outputs 5, 6 supplying respective signals EN1, EN2. Signal EN1 is supplied to the input 7 of a source stage 8, the output 9 of which presents a reference voltage V1; and signal EN2 is supplied to the input 12 of a limiting stage 13 also supplied with voltage V1 at terminal 14. Voltage V1 is also supplied to one input 15 of a latch type threshold detecting stage 16, a second input 17 of which is supplied with monitored voltage Vb, and the output 18 of which supplies a logic signal LA. The output 18 of detecting stage 16 is connected to an input 20 of a latch stage 21, the output 22 of which supplies an OUT signal for logic portion 102 and/or other circuits of memory 100, and stages 16 and 21 present respective reset inputs 24, 25 supplied with a reset signal R.

More specifically, adapting stage 2 provides for adapting the levels of the input logic signals supplied by stages 101 and 102 of memory device 100 to the levels of detecting device 1, and supplies opposite output signals EN1 and EN2 switchable between zero and voltage Vb, so that the high signal EN1 or EN2 is latched to and follows the course of voltage Vb.

Reference source stage 8 provides for generating voltage V1, the value of which, instead of being constant, varies alongside a variation in booster voltage Vb. More specifically, when enabled by signal EN1, voltage V1 is initially latched to and follows the exact course of Vb. Upon Vb reaching a first threshold Vth1, voltage V1 continues rising, but not as fast as Vb, thus resulting in a voltage difference ΔV of other than zero between terminals 15 and 17 of detecting stage 16, and, upon Vb reaching the desired steady-state value, voltage V1 is zeroed.

Limiting stage 13 is only operated in the event the monitored voltage Vb exceeds the given steady value, and provides for two functions: on the one hand, for switching detecting stage 16 in the above case (i.e., Vb exceeding the given steady-state value) when mismatching exists between reference source 8 and detecting stage 16, or, for other reasons, source stage 8 operates abnormally; and on the other, for preventing source stage 8 from being damaged by too high a voltage.

Detecting stage 16 provides for monitoring the voltage difference ΔV at inputs 15 and 17, and for generating output signal LA, the logic value of which indicates whether or not the monitored voltage Vb has exceeded the given threshold.

Latch stage 21 provides solely for interfacing signal LA with the rest of memory device 100.

The device of FIG. 1 operates as follows. Before being turned on, e.g. during first logic state, signal DET=0, device 1 is initially reset by signal R to a pre-enable condition, with signals LA and OUT in a given logic state (e.g. 0) indicating that booster voltage Vb has not yet reached the operating level. The functions requiring booster voltage Vb are disabled, and signals EN1 and EN2, respectively low and high, disable stages 8 and 13.

Upon signal DET switching to high, level adapting stage 2 enables stages 8 and 13 by switching signals EN1 and EN2 to high and low respectively. As stated, signal EN1 therefore assumes the value and follows the exact course of monitored voltage Vb, so that reference source stage 8, in addition to being enabled by the switching of signal EN1, begins monitoring Vb in exactly the same way as detecting stage 16. Voltage V1 is latched to and follows the exact course of Vb, and this continues as long as voltage Vb remains below first threshold value Vth1. In practice, in the above initial phase, the reference source is disabled, and detecting stage 16 itself provides for latching V1 to Vb.

Figure 2:
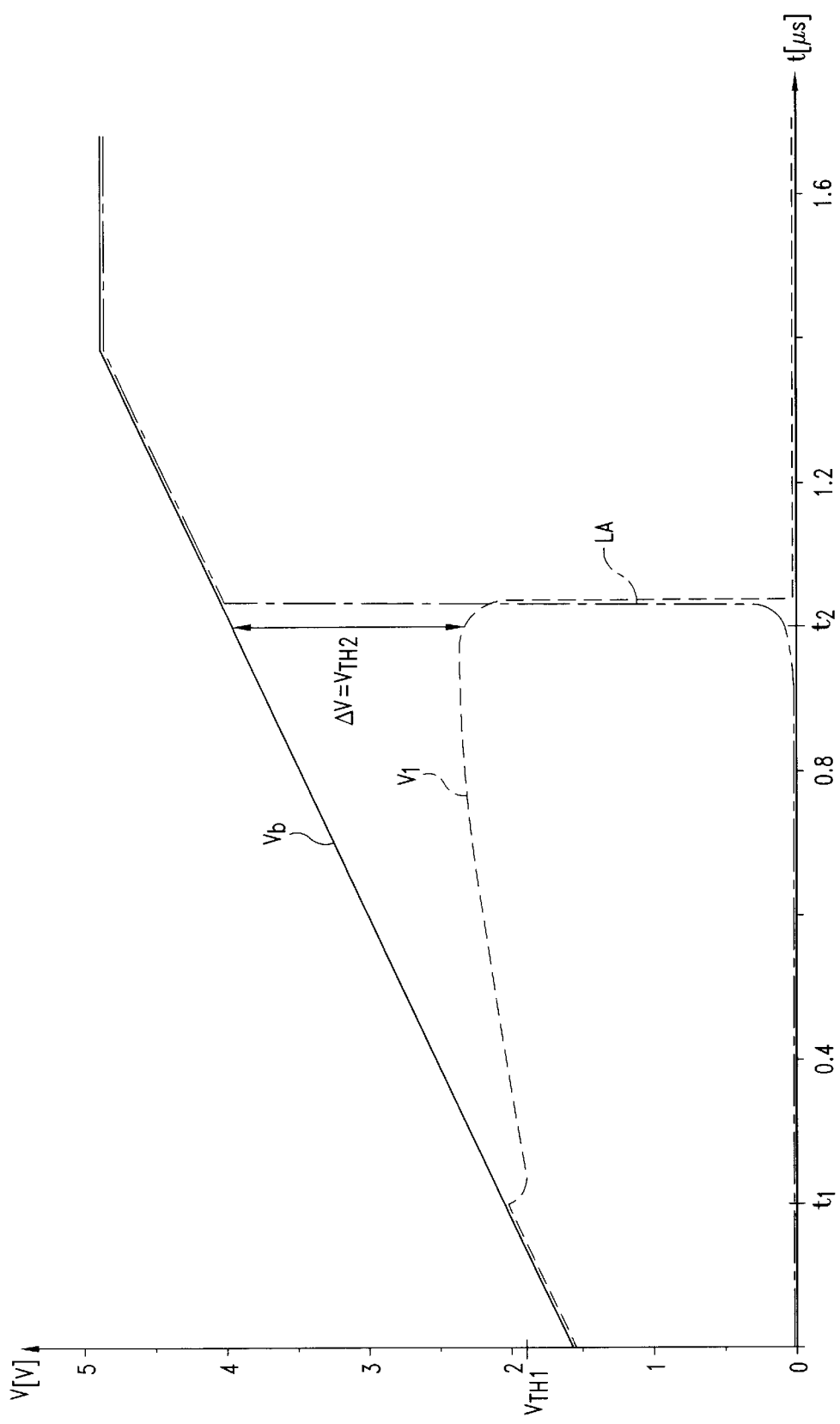
FIG. 2 shows a voltage graph relative to the device of FIG. 1.

Upon Vb exceeding the first threshold value Vth1, reference source 8 is turned on and cooperates with detecting stage 16 so that, as stated, voltage V1 increases more slowly than Vb, as illustrated in FIG. 2, which shows voltage Vb, voltage V1 and output LA of detecting stage 16. As can be seen, upon Vb exceeding threshold value Vth1 at time t1 (FIG. 2), the Vb and V1 curves begin to diverge.

Consequently, in the second phase, a potential difference ΔV of other than zero and increasing alongside an increase in Vb exists between inputs 15 and 17 of detecting stage 16; and upon potential difference ΔV exceeding a second given threshold value Vth2 at time t2, detecting stage 16 switches, and signals LA and OUT switch to high.

As stated, limiting stage 13 is not operated when device 1 functions correctly, whereas, in the event voltage V1 exceeds the given threshold, it is turned on to switch detecting stage 16 and zero voltage V1.

As will be explained in more detail later on with reference to FIG. 3, source stage 8 and detecting stage 16 advantageously cooperate as follows. Upon voltage Vb exceeding first threshold value Vth1, source stage 8 generates a current correlated with the value of Vb and supplied to detecting stage 16, which in turn generates potential difference ΔV between terminals 17, 15, and upon the potential difference, exceeding threshold Vth2, detecting stage 16 switches. The potential difference depends on the current generated by reference source 8 and ultimately on the value of Vb.

Figure 3:
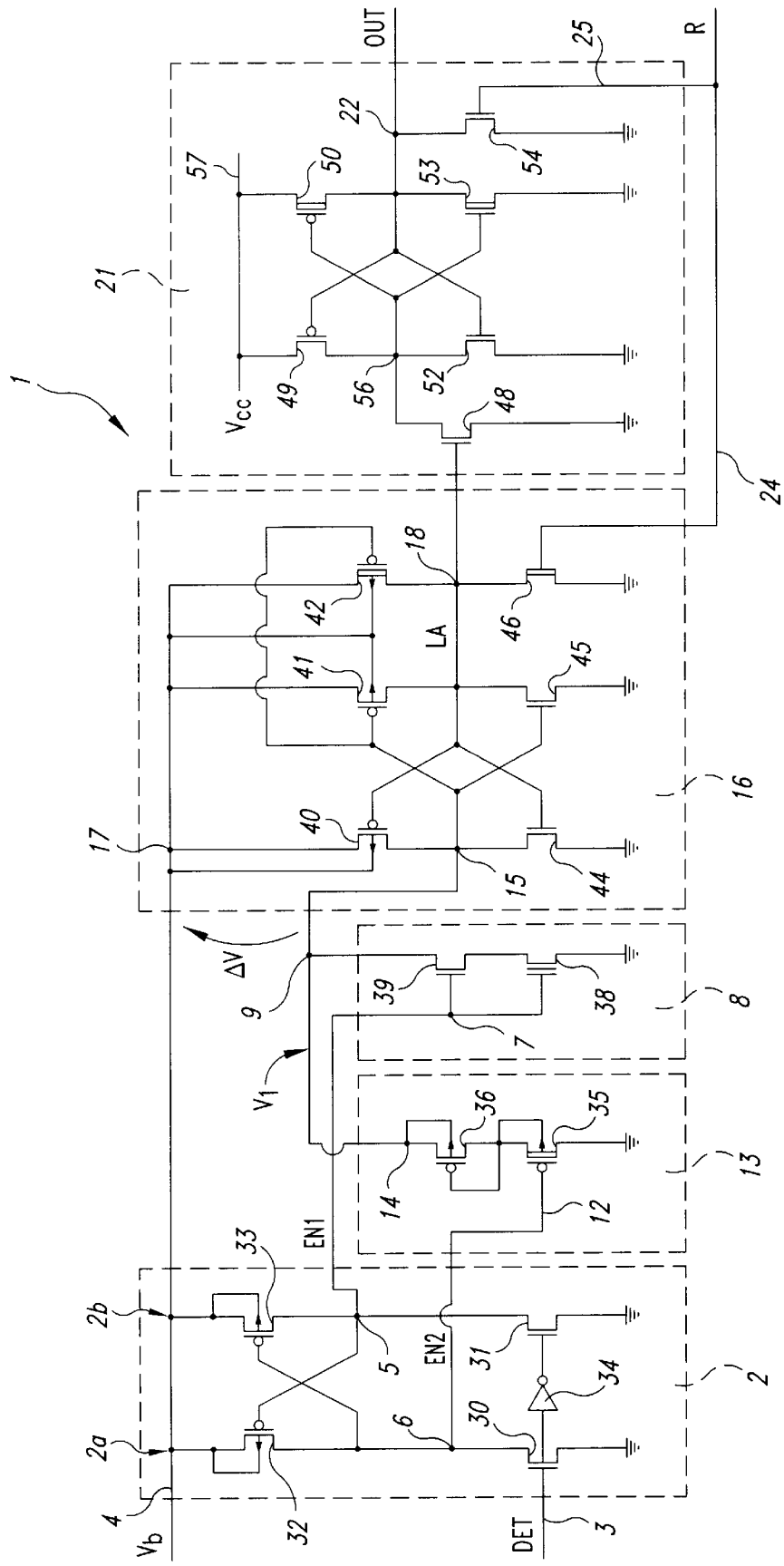
FIG. 3 shows an electric diagram of the device illustrated in FIG. 1.

FIG. 3 illustrates a level adapting stage 2 which includes an N-channel transistor 30 with the gate terminal connected to input 3 of stage 2, the source terminal grounded, and the drain terminal connected to output 6. Input 3 is also connected to the input of an inverter 34, the output of which is connected to the gate terminal of an N-channel transistor 31, the source terminal of which is grounded, and the drain terminal of which is connected to output 5. Stage 2 also includes two P-channel transistors 32, 33 with the source terminals connected to input 4, the drain terminals connected respectively to outputs 6 and 5, and the gate terminals connected respectively to outputs 5 and 6. Transistors 30, 32 form a first branch 2a and transistors 31, 33 a second branch 2b of adapting stage 2.

Limiting stage 13 comprises a native P-channel transistor 35, and a normal P-channel transistor 36 with a modified threshold. The native P-channel transistor is not implanted to alter the threshold during fabrication, and therefore presenting a high turn-on threshold. More specifically, transistor 35 presents the gate terminal connected to input 12 of stage 13 and to output 6 of stage 2, the drain terminal grounded, and the source terminal connected to the drain terminal of transistor 36. Transistor 36, which is diode-connected, i.e., with shorted drain and gate terminals, presents a source terminal forming output 14 of stage 13 and connected directly to terminal 9 of reference source stage 8.

Reference source stage 8 comprises a memory cell 38 similar to memory cells 104, and an N-channel transistor 39. Memory cell 38 presents the control gate terminal connected to input 7 of stage 8, the source terminal grounded, and the drain terminal connected to the source terminal of transistor 39. Transistor 39 presents the gate terminal connected to input 7, and a drain terminal forming output 9 presenting voltage V1.

Detecting stage 16 comprises P-channel transistors 40, 41, 42, and N-channel transistors 44, 45, 46. More specifically, all three P-channel transistors 40, 41, 42 present the source terminal connected to input 17 of stage 16 and all three N-channel transistors 44, 45, 46 present the source terminal grounded. Transistor 40 presents the drain terminal connected to input 15 and to output 9 of stage 8, and the gate terminal connected to output 18 of stage 16. Transistors 41 and 42 are connected in parallel with the drain terminals connected to output 18 and the gate terminals connected to input 15. Transistor 41 is a resistive type, whereas transistor 42 is a high-threshold native type with a high W/L ratio (W/L>>1) to enable it to conduct a high current as soon as its threshold is reached. Transistor 44 presents the drain terminal connected to input 15 and the gate terminal connected to output 18. Transistor 45 presents the drain terminal connected to output 18 and the gate terminal connected to input 15. Transistor 46, a reset transistor, presents the drain terminal connected to output 18 and the gate terminal connected to reset input 24.

Latch stage 21 substantially comprises a flip-flop, and includes an N-channel input transistor 48, two P-channel transistors 49, 50, two N-channel transistors 52, 53, and an N-channel reset transistor 54. More specifically, input transistor 48 presents the source terminal grounded, the gate terminal connected to input 20 of latch stage 21 and, connected directly to output 18 of stage 16, and the drain terminal connected to a node 56. Transistors 49 and 50 both present the source terminals connected to a supply line 57 at supply voltage Vcc. Transistors 52 and 54 both present the source terminal grounded. Transistor 49 presents the drain terminal connected to node 56, and the gate terminal connected to output 22 of latch stage 21. Transistor 50 (native) presents the gate terminal connected to node 56, and the drain terminal connected to output 22. Transistor 52 presents the drain terminal connected to node 56, and the gate terminal connected to output 22. Transistor 53 presents the drain terminal connected to output 22, and the gate terminal connected to node 56. Transistor 54 presents the drain terminal connected to output 22, the source terminal grounded, and the gate terminal connected to input 25 of stage 21 supplied with reset signal R.

The circuit of FIG. 3 operates as follows. Initially, when the memory is turned on, reset signal R is high, and turns on reset transistors 46, 54 to ground outputs 18, 22; the OUT signal is therefore low, indicating booster voltage Vb has not yet reached the steady-state condition. The DET signal is low, so that inverter 34 keeps transistor 30 of stage 2 off and transistor 31 on, and transistor 31 keeps signal EN1 at output 5 low (grounded) and keeps transistor 32 on. Signal EN2 is high and presents the same value as voltage Vb, and both reference source stage 8 and limiting stage 13 are disabled. In this phase, neither of branches 2a, 2b of adapting stage 2 consumes current, by virtue of only one transistor in each branch being turned on. And the same also applies to detecting stage 16, in which the low LA signal keeps transistors 40, 45, 46 on and 44, 41, 42 off, and to latch stage 21 in which transistors 49, 53, 54 are on and transistors 50, 52 off. When reset signal R switches to low and turns off transistors 46, 54 the state of device 1 does not change.

When the DET signal switches to high, transistor 30 is turned on and transistor 31 off, so that signal EN2 at output 6 switches to low, and turns on transistor 33 which latches output 5 to booster voltage Vb. In this phase, therefore, signal EN1 is high and follows the course of Vb, which is increased by the enabling of voltage booster stage 101 in FIG. 1. Transistor 32 is turned off by the high voltage at its gate terminal, so that, once again, no current flows in either of branches 2a, 2b of adapting stage 2.

Source stage 8 stays off as long as the voltage at input 7 is below the turn-on threshold of cell 38, e.g. 2.1 V, which therefore represents the first threshold value Vth1. Below this value, therefore, transistor 40, which is on, keeps voltage V1 at input 15 equal to voltage Vb at input 17, so that voltage V1 follows the course of Vb. In this phase, limiting stage 13 is also off. For limiting stage 13 to be turned on, it requires a voltage V1 of about 2.6–2.7 V, i.e., equal to the sum of the threshold voltage of transistor 35, which is a native transistor with a high threshold of about 1.7 V, and the threshold voltage of transistor 36 at about 0.9–1 V.

Upon voltage Vb exceeding 2.1 V, reference source 8 is turned on and begins drawing a gradually increasing current related to the gate-source voltage drop of cell 38, and which produces a voltage drop between the source and drain terminals of transistor 40 and a divergence of Vb and V1. As booster voltage Vb increases, the voltage drop ΔV between terminals 17 and 15 of detecting stage 16 also increases, this drop is also felt by transistors 41, 42, and transistor 41 is turned on. Being a resistive type, transistor 41, even when turned on, does not initially conduct enough current to switch stage 16, which is switched when voltage drop ΔV roughly equals 1.7 V, i.e., the threshold voltage of native transistor 42. More specifically, components 38, 39 and 40 are so designed that, upon voltage Vb reaching the desired level of about 4 V, memory cell 38 conducts sufficient current to produce in transistor 40 a voltage drop ΔV of 1.7 V, which turns on transistor 42. Memory cell 38 receives voltage Vb via signal EN1 at its control gate terminal. In view of its high W/L ratio, transistor 42, as soon as it is turned on, begins conducting a high current, and rapidly switches output 18 to high, so that transistor 40 is turned off, transistor 44 is turned on, voltage V1 switches rapidly to low (ground), transistor 45 is turned off, and signal LA switches to high indicating the desired threshold voltage has been reached.

Upon signal LA switching, transistor 48 of latch stage 21 is turned on; node 56 switches to low; transistor 50 is turned on and transistor 53 off, output 22 switches to high (equal to supply voltage Vcc); transistor 49 is turned off and transistor 52 on; and the circuit is brought to a stable condition indicating the desired threshold has been reached by Vb, and can only be reset by memory 100 being turned off and back on again, in which case the above sequence is repeated.

Device 1 only consumes current during evaluation, and more specifically via detecting stage 16 in the interval between reference source 8 being turned on and detecting stage 16 being switched, by virtue of the current path formed by transistor 40 and source stage 8. After detecting stage 16 switches, no current path exists between the high-voltage line (input 17) and ground, by virtue of transistors 40, 45 and 46 being off. Similarly, no current is consumed by latch stage 21, by virtue of transistors 49 and 53, which are off, cutting off any possible path between supply line 57 and ground.

Device 1 adapts automatically to any process spread which might result in a slight deviation in component performance, particularly as regards the conductivity of cell 38 and the matching between cell 38 and transistor 40, which, as stated, are important for ensuring correct operation of the device.

As cell 38 is an N-channel and transistor 40 a native P-channel type, mismatching affecting the precision of device 1 may occur. More specifically, two situations may arise: high conductivity of cell 38 resulting in early switching of device 1 or low conductivity, which slows down the cell and may result in an excessive increase in voltage V1 before the device switches. The first situation is not critical, in that, being formed simultaneously with and using the same process as for cells 104 of memory 100, cell 38 is well adapted to the characteristics of cells 104. Since, in the preferred embodiment, memory cell 38 is made by the same process steps and is of the same type and design as memory cells 104 of the array, any characteristics of cells 104 will also be characteristics of memory cell 38. Any variation in the process from lot to lot will affect both cells. Consequently, even if the conductivity of cells 104 and cell 38 are slightly above design level, so that cell 38 generates the device 1 switching current before voltage Vb reaches the given steady-state value, early generation of the OUT signal in no way affects the operation of device 1, by virtue of the memory cells also presenting a high conductivity and therefore also being readable correctly at a slightly lower than rated booster voltage Vb.

The second situation, on the other hand, which may ultimately impair the operation of device 1, is prevented by limiting stage 13. In the event of poor conductivity of cell 38 and cells 104, so that, at the given steady-state booster voltage, they conduct a current below design level and insufficient to switch detecting stage 16, voltage V1 and hence the voltage between the drain and source terminals of cells 38 may increase excessively, thus resulting in soft writing of cell 38, which, if repeated, may alter the characteristic and hence the reliability of cell 38 as a reference. The same problem also occursexists in the case of mismatching of cell 38 and transistor 40, i.e., in the event cell 38, at the given steady-state booster voltage, performs as designed, but transistor 40 generates a voltage drop ΔV insufficient for switching.

In the above cases, however, the closer matching of transistor 40 and transistors 35, 36 is exploited, seeing as all three are of the same type and therefore fabricated together. More specifically, as soon as voltage V1 tends to exceed the threshold value of 2.7 V of limiting stage 13, this is turned on and generates additional current which is added to that of reference source 8 and is sure to switch detecting stage 16. Limiting stage 13 thus provides for correctly switching device 1 upon booster voltage Vb reaching the given threshold value, and, at the same time, for preventing a further increase in voltage V1 and soft writing of cell 38.

Using a memory cell 38 as a threshold element for turning on source stage 8 is not only advantageous in permitting device 1 to adapt automatically with respect to the characteristics of memory array 103. By presenting a higher turn-on threshold as compared with normal MOS transistors, memory cell 38 also provides for turning on source stage 8 later, thus delaying the instant in which current begins to flow through transistor 40 and so reducing consumption of detecting stage 16 during evaluation.

Transistor 39 of source 8, which forms a cascade configuration, also provides for protecting cell 38, and more specifically for preventing too high a voltage, over 1 V for reading the cell, at the drain terminal of cell 38, even when booster voltage Vb has almost reached the steady-state value.

Device 1 also presents the advantage of not being subject to oscillation, by virtue of latch type circuits also being used for forming detecting stage 16; Device 1 is independent of the value of supply voltage Vcc; and Device 1 operates reliably, maintaining the same trigger level, for any transient state (slow or fast) in supply voltage.

Figure 4:
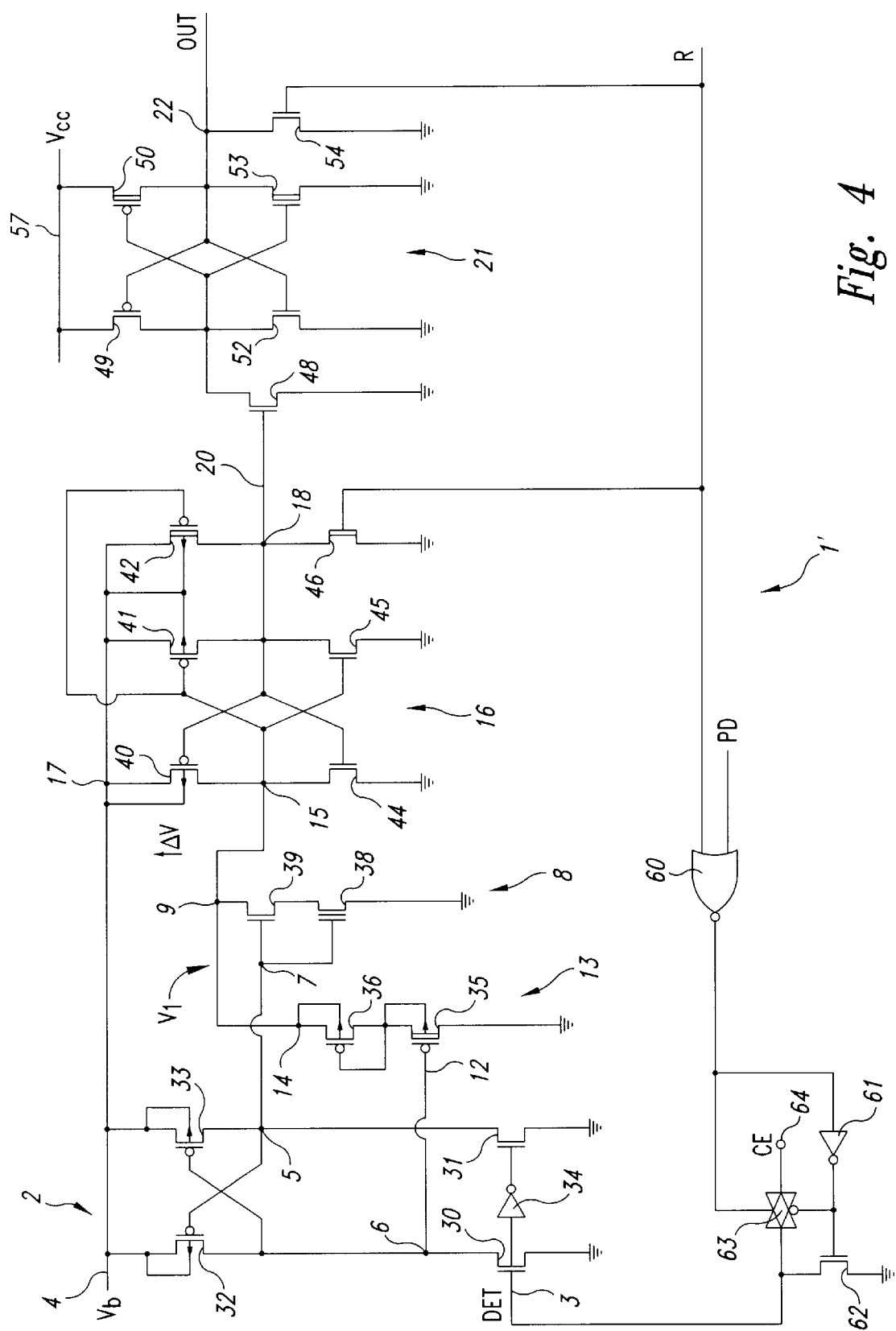
FIG. 4 shows an electric diagram of a variation of the device illustrated in FIG. 3.

FIG. 4 shows a variation in which, unlike device 1 in FIG. 3, detecting device 1' may be turned on pulsatedly and even repeatedly following enabling of memory device 100.

More specifically, device 1' comprises a level adapting stage 2, a reference source stage 8, a limiting stage 13, a threshold detecting stage 16, and a latch stage 21 identical to those in FIG. 3, and the components of which are therefore indicated using the same numbering system with no further description.

In device 1', signal R is also supplied to one input of a NOR gate 60, the other input of which is supplied with a signal PD. The output of NOR gate 60 is connected to the input of an inverter 61, the output of which is connected to the gate terminal of an N-channel transistor 62 with its source terminal grounded and its drain terminal connected to input 3 of level adapting stage 2. A switch 63 is provided between an input 64 presenting enabling signal CE of device 1' and node 3; and switch 63 presents a pair of complementary control terminals, one connected to the output of NOR gate 60, and the other to the output of inverter 61.

In device 1', instead of being generated externally, e.g. by logic portion 102, the DET signal at input 3 of level adapting stage 2 is generated internally on the basis of signals PD and CE. More specifically, when memory 100 is enabled and reset signal R switches to high, the output of NOR gate 60 switches to low, the output of inverter 61 switches to high, and transistor 62 is turned on and switches input 3 to low. At the same time, signal R is present at the gate terminals of transistors 46, 54, so that device 1' is reset in the same way as for device 1 in FIG. 3.

When reset signal R switches to low, and upon normally-high signal PD switching to low, the output of NOR gate 60 switches to high, the output of inverter 61 switches to low, transistor 62 is turned off, and switch 63 is therefore enabled and supplies input 3 with the logic state at input 64. The state of signal DET is therefore determined by that of signal CE. If CE is high, DET switches to high to enable the evaluation phase described with reference to FIG. 3.

Unlike the FIG. 3 embodiment, device 1' is capable of being reset and performing a further evaluation phase under control of logic portion 102. For which purpose, logic portion 102 first resets detecting stage 16 and latch stage 21 by switching signal R to high, which in this case constitutes a reset in the real sense of the word. Upon signal R switching back to low, in the same way as described above, low switching of signal PD provides for closing switch 63 and latching DET to CE. More specifically, if CE is high, the evaluation phase is again enabled.

Figure 5:
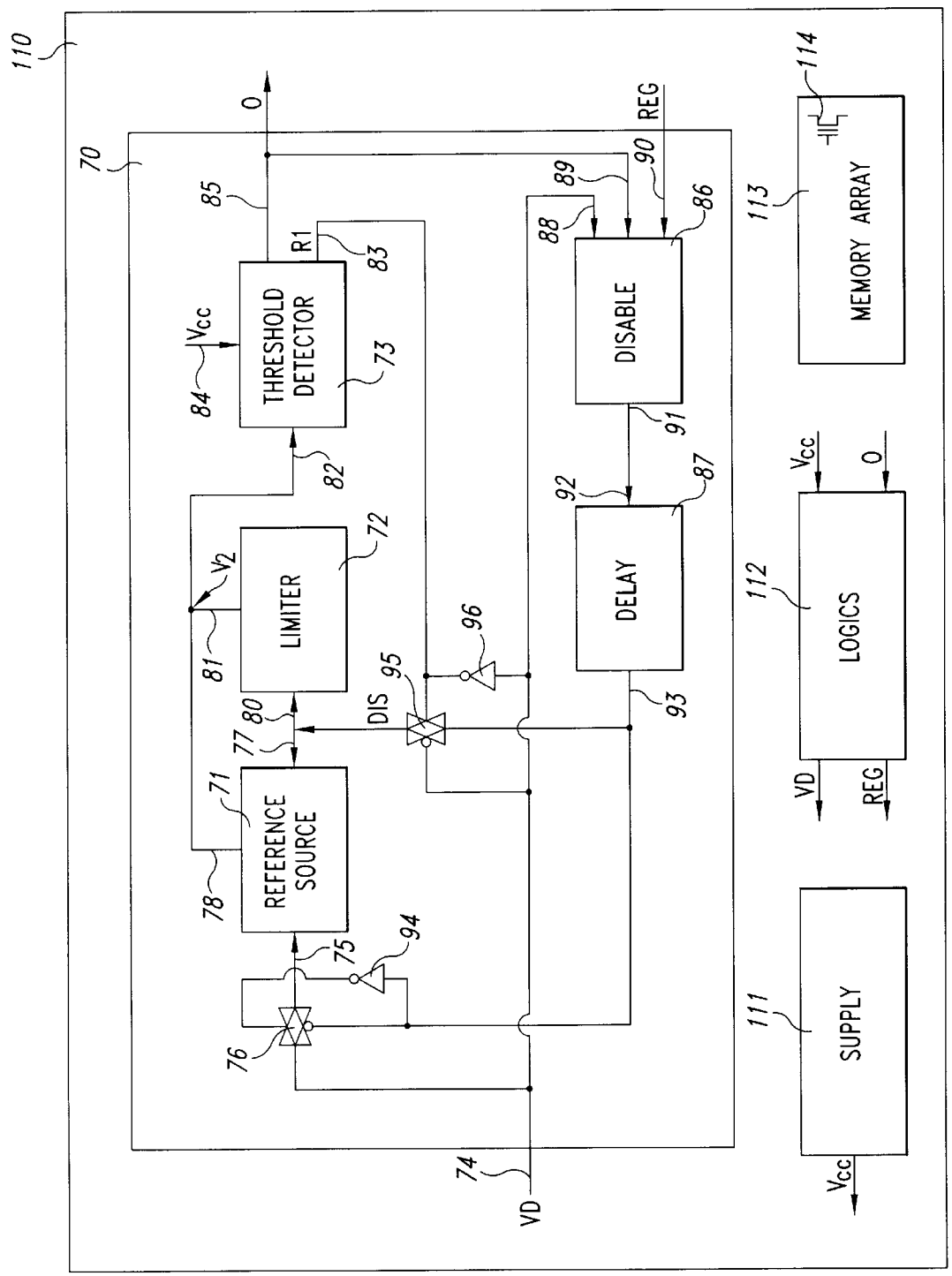
FIG. 5 shows a block diagram of a further embodiment of the present device for monitoring supply voltage.

FIG. 5 shows a block diagram of a further embodiment of the present invention, and more specifically of a device 70 for monitoring supply voltage Vcc. Like devices 1 and 1' in FIGS. 1, 3 and 4, device 70 forms part of a known memory 110 comprising a supply stage 111 generating supply voltage Vcc; and a logic portion 112 supplied by stage 111 with supply voltage Vcc, and by device 70 with an output signal O, the logic value of which indicates whether supply voltage Vcc has reached a given threshold. Logic portion 112 generates a regulating signal REG, and a logic signal VD which, when high, is latched to supply voltage Vcc. Memory 110 also comprises a memory array 113 comprising memory cells 114, and logic portion 112 and array 113 may comprise the same components 102 and 103 as in memory 100.

Device 70 comprises a reference source stage 71, a limiting stage 72, and a threshold detecting stage 73 similar to stages 8, 13, 16 in FIG. 1. More specifically, reference source 71 presents an input 75 connected to the input 74 of device 70 via a switch 76; a disabling input 77 presenting a signal DIS; and an output 78. The input 74 of device 70 is in turn connected to the output of logic portion 112 by which it is supplied with signal VD; and, like stage 8, reference source stage 71 generates at output 78 a voltage V2 varying according to the value of supply voltage Vcc. Limiting stage 72 presents an input 80 also supplied with signal DIS, and a terminal 81 connected to the output 78 of reference source 71. Detecting stage 73 presents an input 82 connected to output 78 of reference source 71; a reset input 83 presenting a signal R1; an input 84 supplied with supply voltage Vcc; and an output 85 presenting signal O.

Device 70 also comprises a disabling stage 86 and an asymmetric delay stage 87. Disabling stage 86 provides for disabling device 70 when supply voltage Vcc reaches the threshold value or in the presence of a regulating function, enabling of voltage booster circuits in the presence of a low supply voltage Vcc, and presents a first input 88 connected to input 74 of device 70. A second input 89 is connected to output 85 of detecting stage 73 and supplied with signal O. A third input 90 is connected to logic portion 112 by which it is supplied with signal REG. An output 91 is connected to the input 92 of asymmetric delay stage 87.

Asymmetric delay stage 87 presents an output 93 connected to an inverted control input of switch 76, the direct input of which is also connected to output 93 via an inverter 94. Output 93 is also connected to inputs 77 and 80 of stages 71 and 72 via a switch 95 presenting an inverted input connected to input 74 of device 70, and a direct input connected to input 74 via an inverter 96.

To begin with, signal REG of device 70 in FIG. 5 will be assumed to present a first logic value (e.g. high) indicating the absence of voltage regulating functions. Initially, after memory 110 is turned on, signal VD is low, so that the output of inverter 96 is high and switch 95 is on; signal VD supplied to input 88 resets disabling stage 86. The signal (high) at output 92 is supplied by delay stage 87 to the input of witch 95 after a brief delay. Being on, switch 95 supplies disabling signal DIS to inputs 77 and 80 to disable stages 71 and 72. With signal R1 at input 83, inverter 96 also maintains detecting stage 73 in the pre-enabling condition, with signal O in a given logic state (e.g. 1) indicating that supply voltage Vcc has not yet reached the given threshold. And the low output of delay stage 87 keeps switch 76 on and permits signal VD to be supplied to input 75 of reference source 71, which is anyway disabled by signal DIS.

Upon signal VD switching to high, the output of inverter 96 switches to low; switch 95 opens; stages 71, 72 no longer receive disabling signal DIS at inputs 77, 80 and are turned on; and the high logic level at input 88 switches disabling stage 86 to standby pending switching of signal O or REG. As long as signals O and REG remain high, disabling stage 86 does not switch and does not turn on delay stage 87, so that switch 76 remains on.

In the meantime, reference source stage 71, no longer disabled by signal DIS, begins monitoring supply voltage Vcc via signal VD. More specifically, and as described with reference to FIG. 1, reference source 71 cooperates with detecting stage 73 to supply a voltage V2 initially latched to and following the exact course of supply voltage Vcc, and which subsequently, when voltage VD or V2 reaches a first threshold increases more slowly. In other words, as previously, reference source 71 is initially disabled, and threshold detecting stage 73 provides for latching V2 to Vcc; reference source 71 is then turned on to generate a potential difference increasing alongside Vcc. Upon the potential difference exceeding a second given threshold, detecting stage 73 switches and signal O at output 85 switches to low to indicate the supply voltage has reached the given threshold.

The switching of output signal O is detected by disabling stage 86, which switches and enables asymmetric delay stage 87. Stage 87, the output of which switches in relation to the input with a delay depending on the switching edge, switches to high with a delay greater than that with which it switches to low, so that, after a given delay, switch 76 opens to cut off voltage VD, equal to supply voltage Vcc to reference source 71, and device 70 is turned off automatically.

The same turn-off procedure is also enabled by high-to-low switching of signal REG indicating a regulation in supply voltage, e.g. enabling of a voltage booster to supply booster voltage Vb. This condition is obviously typical of devices operating at such a low supply voltage that Vcc can never reach the given threshold, in which case, logic portion 112 switches signal REG to low to disable device 70 after a given delay determined by stage 87.

Limiting stage 72 provides for exactly the same function as stage 13 of device 1 in FIG. 1, i.e., for switching detecting stage 73 upon voltage V2 exceeding a given value, to compensate for mismatching of reference source 71 and detecting stage 73, and for protecting reference source 71.

Figure 6:
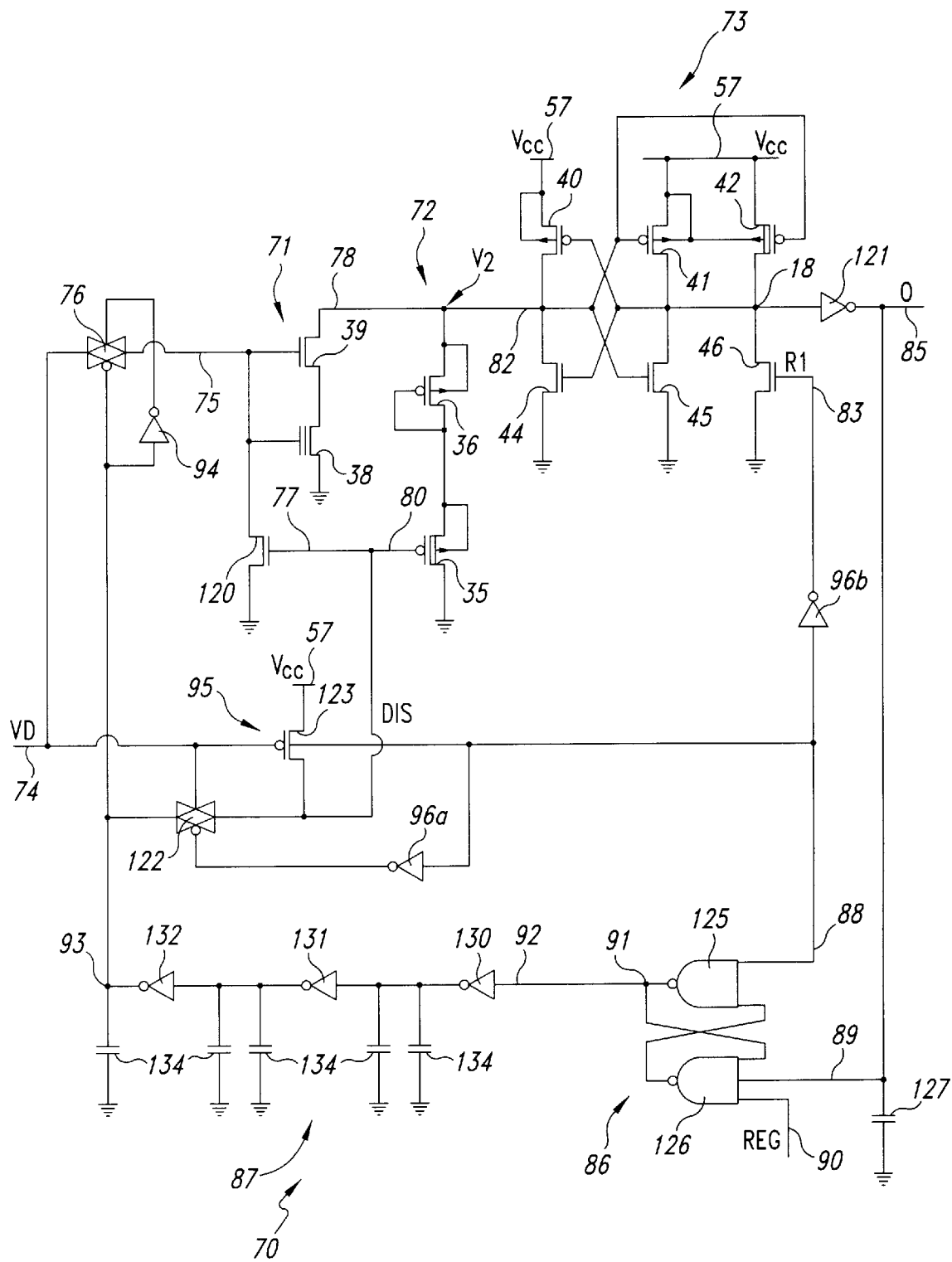
FIG. 6 shows an electric diagram of the device illustrated in FIG. 5.

One embodiment of device 70 is shown in FIG. 6 in which the components of stages 71, 72, 73, which are identical to those of stages 8, 13, 16, are indicated using the same numbering system, with no further description.

More specifically, in addition to memory cell 38 and transistor 39, reference source stage 71 comprises an N-channel disabling transistor 120 with its source terminal grounded, its gate terminal connected to input 77 of stage 71, and its drain terminal connected to input 75 of stage 71, gate terminals of components 38, 39. In addition to transistors 40–42 and 44–46, detecting stage 73 comprises an output buffer or an input of which is connected to terminal 18, and the output of which is connected to terminal 85.

In FIG. 6, inverter 96 is duplicated, and comprises a first inverter 96a controlling switch 95, and a second inverter 96b connected to input 83 of detecting stage 73; and switch 95 in FIG. 5 is replaced by a switch 122 and a transistor 123. More specifically, switch 122 is connected between output 93 of delay stage 87 and inputs 77, 80 of stages 71, 72, and comprises a direct input connected to input 74 of device 70, and an inverted input connected to the output of inverter 96a. P-channel transistor 123 presents the gate terminal connected to input 74 of device 70, the drain terminal connected to inputs 77, 80 of stages 71, 72, and the source terminal connected to supply line 57 at voltage Vcc.

Disabling stage 86 substantially comprises a flip-flop, and includes a first and second NAND gate 125, 126. More specifically, first NAND gate 125 presents a first input forming input 88 of stage 86, a second input connected to the output of NAND 126, and an output forming output 91. Second NAND gate 126 presents a first input connected to output 91, and a second and third input forming inputs 89, 90 and supplied respectively with signals O and REG; and input 89 is also grounded via a capacitor 127.

Delay stage 87 is formed by the cascade connection of a given number of inverters, in this case, three, 130, 131, 132 located between input 92 and output 93 of stage 87, and the outputs of which are grounded via capacitors 134.

Briefly, device 70 in FIG. 6 operates as follows. To begin with, when signal VD is low, the output of gate 96b is high, so that transistor 46 is on, node 18 is low, detecting stage 73 is reset, and output signal O is high. At the same time, the output of inverter 96a is also high and together with signal VD turns off switch 122. Transistor 123 is on and maintains inputs 77, 80 at voltage Vcc; transistor 35 is therefore off and limiting stage 72 disabled; and transistor 120 is on and keeps the gate terminals of components 38, 39 grounded to disable source stage 71. As input 88 is low, the outputs of NAND gate 125 and inverter 131 are high and output 93 of inverter 132 is low; switch 76 is therefore on, and supplies low signal VD to source stage 71 to confirm its off condition; and, together with signals O and REG at inputs 89, 90, the high output of NAND gate 125 keeps the output of NAND gate 126 low.

Upon VD switching to high, the input of gate 125 connected to the output of gate 126 remains low and prevents disabling stage 86 from switching. Switch 76 remains on and supplies source stage 71 with signal VD which increases alongside supply voltage Vcc; R1 switches to low to enable detecting stage 73, turn off transistor 123, and turn on switch 122; and switch 122 connects output 93 (low) of delay stage 87 to inputs 77, 80 of stages 71, 72. Transistor 35 comes on to enable limiting stage 72, and transistor 120 goes off to enable source stage 71 and device 70 then operates in the same way as device 1, bearing in mind that voltage VD follows the exact course of supply voltage Vcc. To begin with, therefore, device 70 remains in the condition described previously as long as supply voltage Vcc remains below a first threshold; reference source 71 is then turned on and begins drawing current, so that voltage V2 increases less than Vcc; and, upon voltage V2 reaching a second threshold corresponding to the desired steady-state value of supply voltage Vcc, detecting stage 73 switches, terminal 18 switches to high, and signal O switches to low.

At this point, NAND gate 126 receives a low signal at input 89 and switches to high, thus switching NAND gate 125 which receives two high signals at the input. Gate 125 in turn switches to supply a low output signal and switch inverters 130, 131, 132 in cascade fashion with a given delay and the signal at output 93 of stage 87 switches to high, turns off switch 76, which therefore cuts off signal VD to the input of source stage 71, and again turns transistor 35 off and transistor 120 on to disable stages 71, 72.

Device 70 is also disabled as described above in the event signal REG switches to low. In regulating mode in which supply voltage Vcc is low and cannot reach the given threshold value, the low logic level of signal REG provides, after a given time, for disabling and so cutting off consumption by device 70.

By featuring the same reference source, level limiting and threshold detecting stages described in detail with reference to FIG. 3, device 70 also presents the same advantages in terms of low consumption and adaptability.

Clearly, changes may be made to the device as described and illustrated herein without, however, departing from the scope of the present invention. In particular, the individual stages may be formed differently from those described above. For example, latch stage 21 in FIG. 3 may be replaced by a simple buffer as in FIG. 4, or by a level adapting circuit similar to stage 2. Instead of using transistors 46, 54, detecting stage 16 or 73 and latch stage 21 may be reset by unbalancing their structure and so sizing the components that they are reset as required (low output node 22 in FIGS. 3, 4, and low node 18 in FIG. 6) before the given threshold is reached. In that case, a capacitive element, e.g. in the form of an N+ diffusion is advantageously provided between node 18 and ground (FIG. 6) or between node 22 and ground (FIGS. 3 and 4).

I claim:

1. A threshold crossover detecting method comprising the steps of:

supplying a monitored voltage varying between a first and second value;

generating a comparison voltage increasing more slowly than said monitored voltage;

comparing said monitored voltage and said comparison voltage; and generating a threshold crossover signal in the event the difference between said monitored voltage and said comparison voltage exceeds a predetermined threshold value.

2. A threshold detecting device comprising:

a detecting stage having a first input supplied with a monitored voltage varying between a first and second value, a second input supplied with a comparison voltage, an output supplying a logic signal indicating said monitored voltage has exceeded a threshold; and a comparison source stage having an output coupled to said second input for generating said comparison voltage increasing more slowly than said monitored voltage, wherein said detecting stage includes difference generating means for determining a difference between said monitored voltage and said comparison voltage and comparing means for comparing said difference with a first predetermined threshold value, and for generating a threshold crossover signal when said difference exceeds said first predetermined threshold value.

3. The device of claim 2 wherein said comparison source stage further includes an input supplied with said monitored voltage wherein said comparison source stage switches between a first and second operating state when said monitored voltage exceeds a second predetermined threshold value and generating at said output in said first operating state, a comparison voltage equal to said monitored voltage; and in said second operating state, a comparison voltage increasing more slowly than said monitored voltage.

4. The device of claim 3 wherein said detecting stage further includes an electronic component between said first input and said second input and a current source having a control terminal supplied with said monitored voltage, wherein said current source being off in said first operating state and generating a current correlated to said monitored voltage in said second operating state and said electronic component having, between said first input and said second input, a voltage drop correlated to said current.

5. The device of claim 2, further including a latch circuit coupled to said detecting stage output, said latch circuit for latching said threshold crossover signal.

6. The device of claim 5 wherein said detecting stage further includes a first and second branch each formed by a first and second switching element located in series with each other between a first and second line and respectively forming a first and second intermediate node, wherein said first and second switching elements each having a control terminal; said first switching elements of said first and second branches being switched in phase opposition with respect to said second switching elements of said first and second branches; and in that said control terminals of said first and second switching elements of said first branch are connected to said second intermediate node, and said control terminals of said first and second switching elements of said second branch are connected to said first intermediate node.

7. The device of claim 6 wherein said detecting stage further includes a third switching element connected in parallel to said first switching element of said second branch, and having a control terminal connected to said control terminal of said first switching element of said second branch; said third switching element being a high current capacity element.

8. The device of claim 7 wherein said first switching element of said first and second branches and said third switching elements are MOS transistors of a first channel type; said second switch element of the said first and second branches are MOS transistors of a second channel type; and said third switching element is high-threshold native transistor.

9. The device of claim 6 wherein said detecting stage further includes reset element connected to said second intermediate node.

10. The device of claim 9 wherein said reset element further includes a MOS transistor having a first terminal connected to said second intermediate node, a second terminal connected to a reference voltage, and a control terminal supplied with a reset signal and for setting said second intermediate node to a predetermined logic state.

11. The device of claim 3 wherein said comparison source stage further includes at least one element with a high turn-on threshold.

12. The device of claim 11 wherein said high-threshold element further includes a memory cell having a control terminal connected to said input of said comparison source stage; and a cascade transistor having a control terminal connected to said terminal of said memory cell and interposed between said memory cell and said output of said comparison source stage.

13. The device claim 2 further including a limiting stage connected to said second input of said detecting stage.

14. The device of claim 13 wherein said limiting stage further includes a switching element interposed between said second input of said detecting stage and a reference potential line.

15. The device of claim 14 wherein said switching element further includes a high-threshold native MOS transistor of a first channel type.

16. The device of claim 2 wherein said monitored voltage is a booster voltage; and further includes a level adapting circuit having a first input supplied with said booster voltage, a second input supplied with an enabling signal, and an output connected to said comparison source stage.

17. The device of claim 16 wherein said adapting circuit is a latch type booster circuit.

18. The device of claim 16, further including a reset circuit, connected to said level adapting circuit and to said detecting stage, said reset circuit for generating reset signals for said adapting circuit and said detecting stage.

19. The device of claim 2 wherein said monitored voltage is a supply voltage and further includes a disabling stage having a first input connected to said output of said detecting stage, a second input supplied with a control signal, and an output connected to said comparison source stage; said disabling stage generating, at said output, a turn-off signal switchable from a first to a second logic level upon receiving said threshold crossover signal or said control signal.

20. The device of claim 19 further including an asymmetric delay stage interposed between said disabling stage and said comparison source stage; said asymmetric delay stage having means for switching with a first delay upon switching of said turn-off signal from said first to said second logic level, and with a second delay, less than said first delay, upon switching of said turn-off signal from said second to said first logic level.

21. A threshold detecting device comprising:
   a monitored voltage supply;
   a comparison source voltage supply providing a comparison voltage increasing slower than said monitored voltage supply;
   a threshold detecting circuit having difference generating means for determining a difference between said monitored voltage and said comparison voltage and comparison means for comparing said difference with a first predetermined threshold value, and for generating a threshold crossover signal when said difference exceeds said first predetermined threshold value, the threshold detection circuit also having a first input terminal coupled to the monitored voltage supply, a second input terminal, and a threshold output terminal; and
   a level adapter circuit coupled between said monitored voltage supply and said comparison source voltage supply.

22. The device of claim 21, further including a limiter circuit coupled between an enable signal output of the level adapter circuit and the threshold detecting circuit, said limiter circuit being operative when said monitored voltage supply exceeds a predetermined steady state value.

23. The device of claim 22 wherein said enable signal output and a second enable signal output of said level adapter circuit provide control means for determining the active state of said limiter circuit and said comparison source circuit.

24. The device of claim 21 wherein said threshold output terminal of said threshold detecting circuit supplies a logic signal indicating said monitored voltage supply has exceeded a predetermined threshold.

* * * * *